United States Patent [19]

LaPensee

[11] Patent Number: 4,884,032
[45] Date of Patent: Nov. 28, 1989

[54] TRAILER/TRACTOR LIGHT SYSTEM TESTER

[75] Inventor: Kenneth R. LaPensee, Mt. Clemens, Mich.

[73] Assignee: The United States of America as represented by the Secretary of the Army, Washington, D.C.

[21] Appl. No.: 418,920

[22] Filed: Sep. 16, 1982

[51] Int. Cl.⁴ ............................................. G01R 31/02
[52] U.S. Cl. ..................................................... 324/504
[58] Field of Search .................................. 324/51, 504

[56] References Cited

U.S. PATENT DOCUMENTS 3,103,808  9/1963  Eichelberger .
3,428,888  2/1969  Nolte ...................................... 324/51
3,639,777  2/1972  Bolinger .
3,663,939  5/1972  Olsson ............................... 324/51 X
3,716,682  2/1973  Wizemann .
3,737,767  6/1973  Slutsky ................................. 324/51

Primary Examiner—Reinhard J. Eisenzopf
Attorney, Agent, or Firm—David L. Kuhn; Peter A. Taucher

[57] ABSTRACT

A portable testing mechanism for tractor-trailer lighting systems. The mechanism is specially designed to permit a test of the trailer lighting system without the physical presence of the tractor, or to permit test of a tractor light control system without the physical presence of the trailer.

1 Claim, 2 Drawing Sheets

TRAILER/TRACTOR LIGHT SYSTEM TESTER

GOVERNMENT INTEREST

The invention described herein may be manufactured, used, and licensed by or for the Government for governmental purposes without payment to me of any royalty thereon.

BACKGROUND AND SUMMARY OF THE INVENTION

U.S. Pat. Nos. 3,103,808 to P. Eichelberger and 3,737,767 to R. Slutsky disclose mechanism for testing the electrical lighting systems in trailers without requiring the presence of a tractor. I propose a mechanism that can be used to test both the trailer lighting system and the tractor electrical power supply system; the trailer test can be performed without the physical presence of a tractor, and the tractor test can be performed without the physical presence of a trailer.

U.S. Patent to I. Nolte disclose testing mechanisms that require the physical presence of both a tractor and a trailer to complete the test. I propose a system that has dual function test capability on a trailer or tractor without requirement for the physical presence of the other unit (trailer or tractor).

THE DRAWINGS

Figure 1:
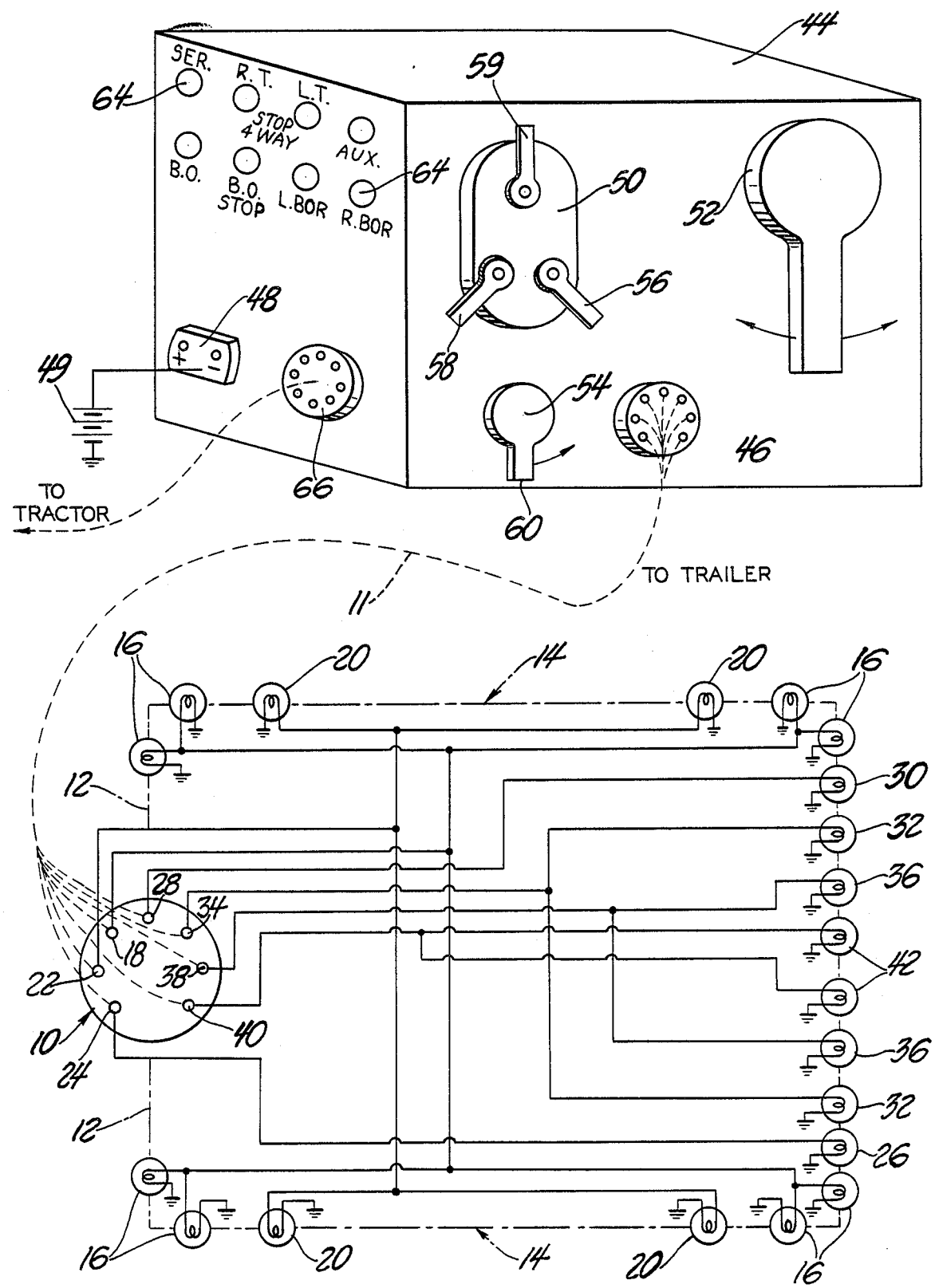

FIG. 1 shows one embodiment of my improved tester, together with an illustrative trailer lighting system subject to test.

Figure 1C:
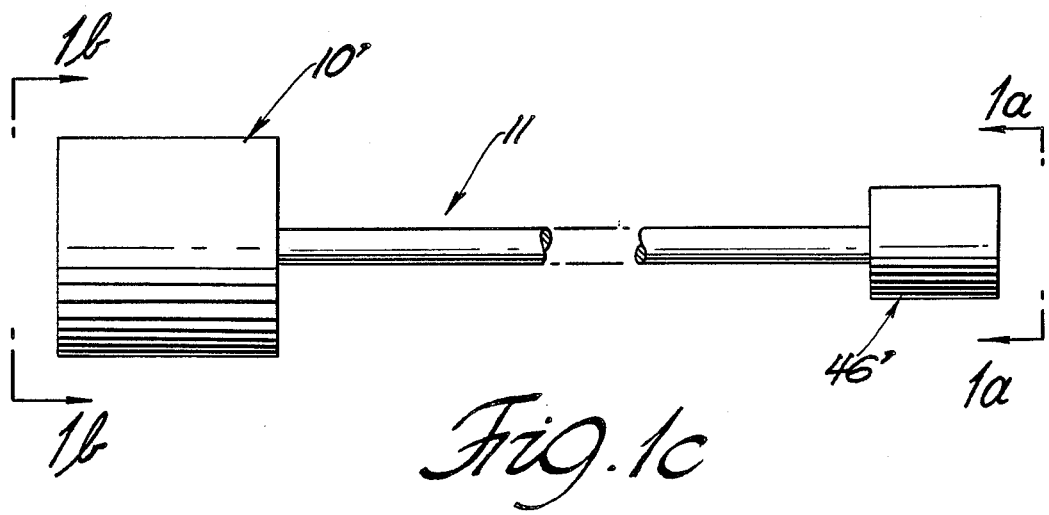
Figure 1B:
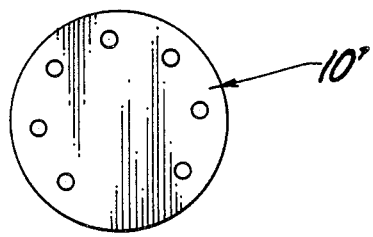
Figure 1A:
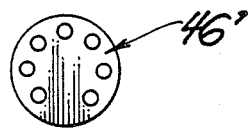

FIGS. 1a, 1b, and 1c show a cable for connecting my tester to a trailer.

FIG. 2 illustrates circuit connections that can be employed within cabinet 44 between receptacle 66 and lamps 64 (upper portion of the Fig.). FIG. 2 also illustrates circuit connections that can be employed between receptacle 46 and electrical components 50, 52 and 54 (lower portion of the Fig.).

The illustrated system comprises a conventional multiterminal receptacle 10 mounted on the front end 12 of a van-type trailer 14 for receiving a mating electrical fitting on a multi-conductor cable extendable from the rear end of a nonillustrated tractor. The trailer lighting system comprises eight service lamps 16 at the four corners of the trailer; suitable wiring connects these lamps to terminal 18 in receptacle 10.

This invention was designed particularly for use with military trailers adapted to function in wartime under blackout conditions. Trailer 14 carriers four reduced luminosity blackout lights 20 having electric connections with terminal 22. Terminal 24 provides power for left turn indicator lamp 26, whereas terminal 28 provides power for right turn indicator lamp 30. The brake-actuated stop lights 32 are electrically connected to terminal 34. Terminal 40 is connected to the blackout stop lights 42.

The drawing is roughly illustrative of actual systems supplied with electrical power through a receptacle at the front end of the trailer. Actual systems are often more complex than that shown in the drawing. The more complex systems require a greater number of terminals in the receptacle.

My invention, as shown in the drawing, involves a portable cabinet 44 having a multi-terminal electrical receptacle 46 identical to the receptacle employed on the rear end of the tractor that is used to tow trailer 14. Receptacle 46 has the same number of terminals as receptacle 10. A cable 11 having seven conductors therein (one for each terminal) can be trained between receptacles 46 and 10 to deliver electrical power from cabinet to trailer 14. When the trailer circuits are being tested, cable terminal 46' is engaged with receptacle 46 on cabinet 44 and cable terminal 10' is engaged with receptacle 10 on the trailer 14.

Power may be initially supplied to cabinet 44 by a battery having a rating similar to the tractor battery power source. A battery cable is plugged onto receptacle 48 to deliver power to wiring within cabinet 44.

Alternately receptacle 48 could be used to connect building supply current to the cabinet 44 wiring; a transformer would be located within the cabinet. The cabinet internal wiring provides electrical power to light switch 50, turn signal controller 52 and brake switch simulator 54. Switch 50 is identical to a conventional multi-function light switch already used in U.S. military trucks and tractors. The switch includes a lockout handle 56 swingable between locked and unlocked positions, and an auxiliary switch handle 58 selectively swingable from an off position to various positions controlling the parking lights and instrument panel illumination. Switch 50 also includes a main handle switch 59 swingable from an off position to various positions controlling the service lamps and blackout lights. Turn signal controller 52 is identical to a conventional device used in military vehicles at the steering wheel for initiating the left and right turn signals. Controller 52 can be constructed as shown in U.S. Pat. No. 3,716,682. The controller is connected to receptacle 46 via conventional flasher elctronics of the type shown generally in U.S. Pat. No. 3,639,777; the electronics unit is located within cabinet 44. Brake switch simulator 54 is a spring-biased switch having a manual lever 60 movable against the spring bias to deliver electrical power to an appropriate brake pin terminal in receptacle 46. Simulator 54 duplicates the action of a conventional brake-actuated switch in the tractor.

The various components 50, 52 and 54 are electrically interconnected with each other and with the two receptacles 48 and 46 in the same fashion as their counterparts in the actual tractor. When a conventional cable 11 is trained between receptacles 46 and 10 cabinet 44 can be used to test the trailer lighting system without the presence of a full-size tractor.

Switch 50 tests for operability of service lights 16, blackout lights 20, taillights 36, and dome light 36. Controller 52 tests for operability of turn indicator lamps 26 and 30. Brake switch simulator 54 tests for operability of stop lights 32 and 42. The test operations involve visual inspection of the lamps on the trailer.

It is intended that cabinet 44 will also be useful for testing the tractor power supply that normally delivers power to the cable trained between the tractor and trailer. The cabinet contains a number of indicator lamps 64 that simulate actual lamps on the trailer. Each lamp is wired to the terminal on a multiterminal receptacle 66 that is identical to a receptacle used on the real trailer; a resistance may be associated with each lamp 64 to simulate actual circuit values in the trailer lighting system. In conducting a test of the tractor power supply the conventional multi-conductor cable is trained between receptacle 66 and a nonillustrated receptacle on the rear end of the tractor. The switches, turn signal controller and brake pedal in the tractor are operated in usual fashion while an observer may note the condition of each indicator lamp 64 in cabinet 44. The test establishes that electric power will, or will not, be delivered from the tractor to a trailer when the tractor is put into service.

It is contemplated that cabinet 44 will be a relatively small size structure measuring only a few inches on a side. Because of its small size the cabinet can be placed on the seat in the tractor cab next to the driver, such that indicator lights 64 are visible to the driver; cable 11 can be run through an open window of the cab to provide the desired connection between receptacle 66 and the receptacle on the rear end of the tractor. The operation brings the simulated trailer lighting system into the cab for one-man test of the tractor electrical supply system.

The test system is considered an improvement over other known systems in that it enables a test to be performed on a trailer or a tractor without the physical presence of the other vehicle component. Preferably the test hardware includes, to the maximum extent possible, conventional hardware items for receptacles 46 and 66, controller 52 and siwthc 50. Indicator lamps 64 and receptacle 66 associated with the tractor test are mounted on one face of cabinet 44, while the other components 46, 50, 52 and 54 associated with the trailer test are mounted on another face of the cabinet. Such an arrangement promotes correct connection and usage of the apparatus by relatively unskilled personnel without resort to detailed instructional manuals. The various connectors 46, 48 and 66 for the external cables are preferably located in the lower portions of the cabinet to avoid possible interference between cables and the manual switches and indicator lamps.

I claim:

1. Electrical test means for both a military trailer lighting system and an electrical power supply in a military tractor for the lighting system, the test means being configured to provide nonverbal indicia for instructing the human user in operating the test means, the test means comprising;

a three dimensional cabinet having a first upstanding side face and a second upstanding side face; a source of electrical power at the cabinet having a rating similar to the battery power source in the military tractor to be tested;

a first conventional multi-terminal receptacle (46) mounted on the first face of the cabinet; a second conventional multi-terminal receptacle (66) mounted on the second face of the cabinet; the first receptacle being similar to a receptacle used on the tractor; the second receptacle being similar to a receptacle used on the trailer to be tested;

A manual turn signal controller (52) mounted on the first face of the cabinet, the controller being similar to the controller used on the military tractor; a manual multi-function light switch (50) mounted on the first face of the cabinet, the multi-function light switch including a lock-out handle (56) swingable between locked and unlocked positions, an auxilliary switch handle (58) selectively swingable from an off position to various energized positions to control the parking and instrument panel illumination, and a main handle switch (59) swingable from a circuit-breaking position to one of several circuit-completing positions to control vehicle service lamps and blackout lights, the multi-function light switch being similar to a switch used on the military tractor;

a spring biased, manually actuable brake switch simulator means (54) mounted on the first face of the cabinet having a manual lever (60) moveable against the spring bias to deliver electrical power to the appropriate brake pin terminal in the first receptacle (46), whereby the brake switch simulator duplicates the action of a brake actuated switch in a military tractor;

the brake switch simulator means having a different shape than the multi-function light switch and being smaller than the manual turn signal controller, the brake switch simulator means being closer to the multi-function light switch than is the manual turn signal controller, the brake switch simulator means being disposed on a corner of the first face of the cabinet diagonally opposite from the manual turn signal controller, whereby the turn signal controller, the multi-function light switch, and the brake switch simulator are tactiley and visually discernable from one another;

a plurality of trailer condition indicator lamps (64) on the second face of the cabinet;

first electrical connections within the cabinet connecting the first receptacle to the power source, turn signal controller, multi-function light switch, and brake switch-simulator means in generally the same manner as the corresponding components in the tractor, whereby the cabinet simulates a conventional tractor power supply for the trailer lighting system;

second electrical connections within the cabinet connecting the second receptacle to the indicator lamps in generally the same manner as the corresponding lamps on the trailer, whereby the cabinet simulates the trailer light system; the test means being adapted for testing the trailer lighting system by training a cable between the first receptacle and a receptacle on the front end of the trailer; the test means being adapted for testing the tractor power supply by training the cable between the second receptacle and a receptacle on the rear end of the tractor to be tested; the first and second receptacles being located near the cabinet lower extremities to minimize potential interference between the cable and any one of the turn signal controller, multi-function light switch, brake switch-simulator means or indicator lamps.

* * * * *